United States Patent
Chinnakkonda Vidyapoornachary et al.

(10) Patent No.: US 9,891,990 B2
(45) Date of Patent: *Feb. 13, 2018

(54) MEMORY SCRUBBING IN A MIRRORED MEMORY SYSTEM TO REDUCE SYSTEM POWER CONSUMPTION

(71) Applicant: International Business Machines Corporation, Armonk, NY (US)

(72) Inventors: Diyanesh B. Chinnakkonda Vidyapoornachary, Bangalore (IN); Marc A. Gollub, Round Rock, TX (US); Tony E. Sawan, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 149 days.

This patent is subject to a terminal disclaimer.

(21) Appl. No.: 14/835,011

(22) Filed: Aug. 25, 2015

(65) Prior Publication Data
US 2017/0031754 A1 Feb. 2, 2017

Related U.S. Application Data

(63) Continuation of application No. 14/813,220, filed on Jul. 30, 2015.

(51) Int. Cl.
*G11C 29/00* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01); *G06F 3/0625* (2013.01); *G06F 3/0652* (2013.01); *G06F 3/0659* (2013.01); *G06F 3/0673* (2013.01); *G06F 3/0679* (2013.01); *G06F 11/106* (2013.01); *G11C 29/52* (2013.01); *G11C 29/74* (2013.01); *G11C 2029/0409* (2013.01)

(58) Field of Classification Search
CPC .. G06F 11/1068; G06F 3/0625; G06F 3/0619; G06F 3/0673; G06F 3/064; G06F 3/0679; G06F 3/0652; G06F 3/0659; G11C 29/52
See application file for complete search history.

(56) References Cited

U.S. PATENT DOCUMENTS 7,882,323 B2  2/2011  Allison et al.
8,484,521 B2  7/2013  Carman et al.
(Continued)

OTHER PUBLICATIONS

List of IBM Patents or Patent Applications Treated as Related.
(Continued)

*Primary Examiner* — Guy Lamarre
(74) *Attorney, Agent, or Firm* — Matthew C. Zehrer

(57) ABSTRACT

Mirrored memory scrubbing is optimized to reduce system power consumption and increase system performance. A memory scrub operation scrubs a first portion of the mirrored memory to detect and correct soft errors. The scrub rate of a second portion of the mirrored memory is eliminated, minimized, or reduced, relative to the scrub rate of the first portion. The reduced scrub operation preserves power consumed in association with scrubbing the second portion.

7 Claims, 5 Drawing Sheets

(51) Int. Cl.
  *G11C 29/52* (2006.01)
  *G06F 3/06* (2006.01)
  *G11C 29/04* (2006.01)

(56) References Cited

U.S. PATENT DOCUMENTS

| | | |
|---|---|---|
| 2005/0060603 A1 | 3/2005 | Pomaranski et al. |
| 2006/0039196 A1* | 2/2006 | Gorobets .............. G06F 11/106 365/185.01 |
| 2008/0072116 A1 | 3/2008 | Brittain et al. |
| 2011/0055468 A1 | 3/2011 | Gonzalez et al. |
| 2012/0246544 A1 | 9/2012 | Resnick et al. |
| 2012/0284575 A1 | 11/2012 | Foley |
| 2013/0128666 A1 | 5/2013 | Avila et al. |
| 2013/0151767 A1* | 6/2013 | Berke ................ G06F 11/1048 711/105 |
| 2014/0052924 A1* | 2/2014 | Ramaraju ............... G06F 12/12 711/133 |
| 2014/0195867 A1 | 7/2014 | Gollub et al. |
| 2014/0304566 A1 | 10/2014 | Henderson et al. |

OTHER PUBLICATIONS

Lee, Ju-Yueh, et al., "Heterogeneous Configuration Memory Scrubbing for Soft Error Mitigation in FPGAs," IEEE, Field-Programmable Technology (FPT), 2012 International Conference, Dec. 2012.

\* cited by examiner

MEMORY SCRUBBING IN A MIRRORED MEMORY SYSTEM TO REDUCE SYSTEM POWER CONSUMPTION

FIELD OF THE INVENTION

Embodiments of the invention generally relate to computer systems and more particularly to mirrored memory scrubbing to reduce system power consumption and increase system performance.

DESCRIPTION OF THE RELATED ART

Memory scrubbing consists of reading from an electronic system memory location, correcting bit errors (if any) with an error-correcting code (ECC), and writing the corrected data back to the same location.

Due to the high integration density of contemporary computer memory chips, the individual memory locations have become small enough to be vulnerable to cosmic rays and/or alpha particle emission. The errors caused by such phenomena are called soft errors. Soft errors can be a problem for DRAM and SRAM based memories. The probability of a soft error at any individual memory location is very small. However, together with the large amount of memory modern computers, particularly servers, are equipped with, together with extended periods of uptime, the probability of soft errors in the total memory installed is significant.

The information in the memory is stored redundantly enough to correct a single bit error per memory word. In a particular ECC example, a memory controller scans systematically through the memory, single bit errors can be detected, the erroneous bit can be determined using a ECC checksum, and corrected data can be written back to the appropriate memory location. Correctable errors are usually single-bit or double-bit errors within a data word, but some ECC codes allow for up to 8 bits in error within a single byte.

Each memory cell is typically checked periodically, or frequently enough, before multiple bit errors within the same data word are too likely to occur, since one bit errors can be more easily corrected, but the multiple bit errors are more difficult to correct.

In order to not disturb regular memory requests made by a processing unit and thus prevent decreasing system performance, scrubbing is usually only done during idle periods. As the scrubbing consists of normal read and write operations, scrubbing typically increases power consumption compared to a non-scrubbing operation. Therefore, scrubbing is not performed continuously but periodically.

The normal memory reads issued by the processing unit or direct memory access (DMA) devices are checked for ECC errors, but due to data locality reasons they can be confined to a small range of memory addresses, keeping other memory locations untouched for a very long time. These locations can become vulnerable to more than one soft error, while scrubbing ensures the checking of the entire memory within a guaranteed time.

On some systems, the main memory (e.g., DRAM-based) and/or the processing unit caches (e.g., SRAM-based) may be scrubbed. On most systems the scrubbing rates for the main memory and the caches can be set independently. Because cache is much smaller than the main memory, the scrubbing for caches does not need to happen as frequently.

Memory scrubbing generally increases reliability, therefore it is often classified as a reliability, availability, and serviceability (RAS) feature.

Memory mirroring is the division of memory into two portions. Data stored within the first portion is mirrored to the second portion, creating a redundant copy. If a fault occurs within the first portion of the memory, the second portion may be utilized without, or little, disruption. The first portion and the second portion can re-synchronize when repairs are completed. The redundant copies of memory may be maintained to remain redundant.

A disadvantage of memory scrubbing is generally the increased consumption of power related to the reading of the data for correction. Further, additional logic in the memory controller is needed to manage the read operations associated with the correction by inserting read cycles in the scheduler queue. A disadvantage of memory mirroring are costs associated with storing or reading data from one portion of the memory are effectively doubled because memory contents are duplicated.

Memory scrubbing in a full memory mirrored system scrubs both the first portion of memory and the redundant second portion of the memory. Since the same data is available in both the first portion and the second portion, data read power consumption associated with the correction of errors is twice than the non-mirrored memory system.

Considering the above limitations and opportunities, scrub operations in memory mirrored system can be optimized to reduce read power consumption and increase system performance

SUMMARY

In an embodiment of the present invention, a method to reduce power consumption of a mirrored memory subsystem includes scrubbing, with a memory controller, a first portion of a mirrored memory at a reference scrub rate, scrubbing, with the memory controller, a second portion of the mirrored memory at reduced scrub rate less than the reference scrub rate, monitoring, with the memory controller, a soft error rate within data read from the first portion in association with the scrubbing the first portion, and adjusting the reduced scrub rate of the second portion of the mirrored memory based upon the monitored soft error rate.

This and other embodiments, features, aspects, and advantages will become better understood with reference to the following description, appended claims, and accompanying drawings.

DETAILED DESCRIPTION

Embodiments of the invention relate to optimizing memory scrubbing in a mirrored memory system to reduce system power consumption and increase system performance. In embodiments, a memory scrub operation scrubs the first portion of the mirrored memory to detect and correct soft errors. The scrub operation in the second portion of the mirrored memory is eliminated, minimized, or reduced, relative to the scrub of the first portion. For example, the scrub operation may occur in only one portion of the mirrored memory to preserve power associated with scrubbing of the second portion, or vice versa. In another example, the scrub operation scrubs the first portion at a reference scrub rate and scrubs the second portion at a reduced scrub rate, relative to the reference scrub rate to reduce power associated with scrubbing of the second portion, or vice versa.

A particular implementation of the reduction of the scrub rate of a particular portion of the mirrored memory may be a static scrub rate reduction. Such implementation scrubs the first portion at the reference rate and the second portion at a static reduced scrub rate. Another implementation is to dynamically adjust the reduced scrub rate based on the detection of soft errors associated with the scrubbing of the reference memory portion. If the quantity of soft errors detected while scrubbing the reference memory portion exceeds a predetermined threshold, the reduced scrub rate is increased.

Figure 1:
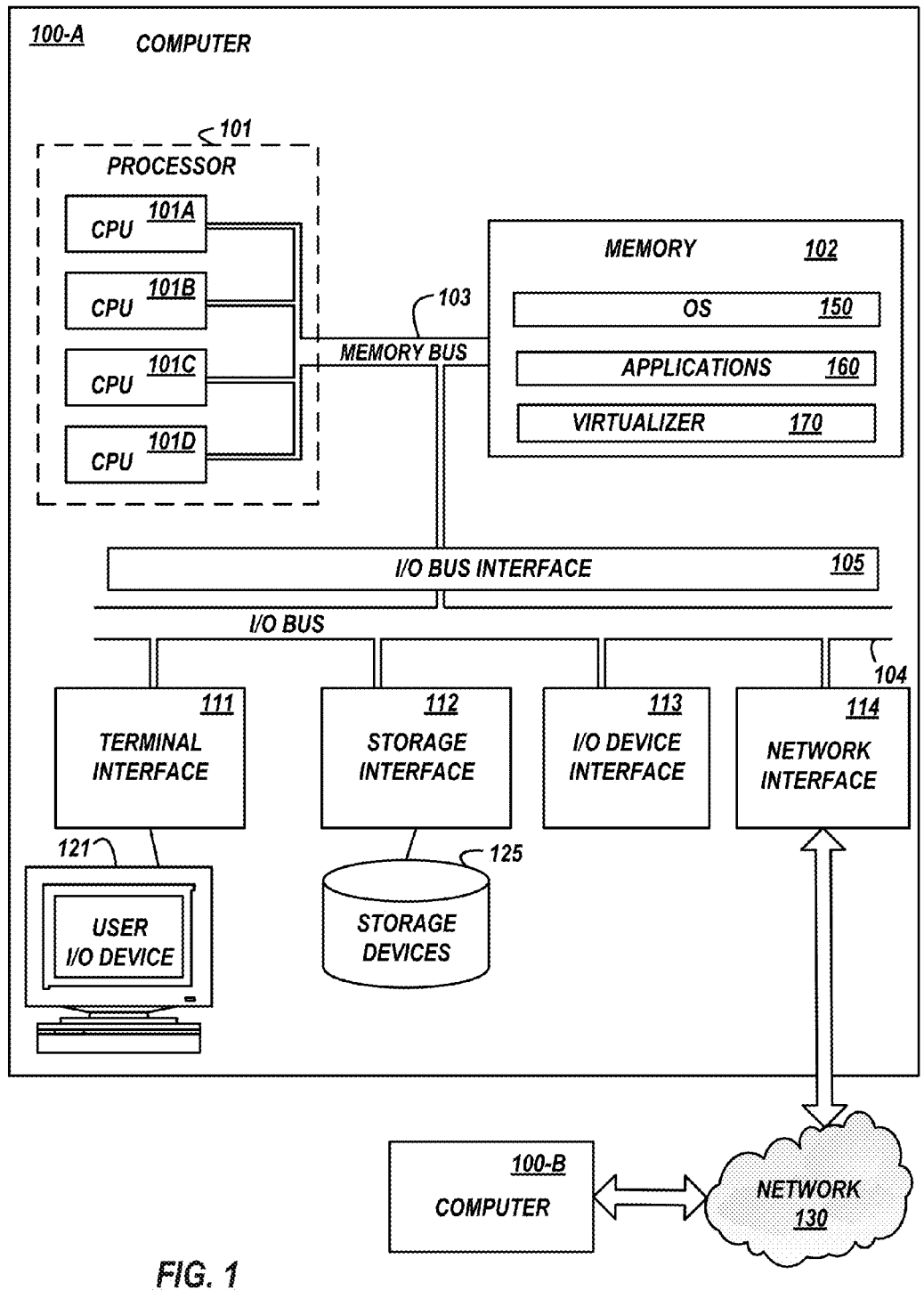
FIG. 1 illustrates a high-level block diagram of an exemplary computer system for implementing various embodiments of the invention.

Referring to the Drawings, wherein like numbers denote like parts throughout the several views, FIG. 1 depicts a high-level block diagram representation of a computer 100-A connected to another computer 100-B via a network 130, according to an embodiment of the present invention. The term "computer" is used herein for convenience only, and in various embodiments is a more general data handling system, such as a mobile phone, tablet, server computer, etc. The mechanisms and apparatus of embodiments of the present invention apply equally to any appropriate data handling system.

The major components of the computer 100 may comprise one or more processors 101, a main memory 102, a terminal interface 111, a storage interface 112, an I/O (Input/Output) device interface 113, and a network adapter 114, all of which are communicatively coupled, directly or indirectly, for inter-component communication via a memory bus 103, an I/O bus 104, and an I/O bus interface unit 105. The computer 100 contains one or more general-purpose programmable central processing units (CPUs) 101A, 101B, 101C, and 101D, herein generically referred to as the processor 101. In an embodiment, the computer 100 contains multiple processors typical of a relatively large system; however, in another embodiment the computer 100 may alternatively be a single CPU system. Each processor 101 executes instructions stored in the main memory 102 and may comprise one or more levels of on-board cache.

In an embodiment, the main memory 102 may comprise a random-access semiconductor memory, storage device, or storage medium for storing or encoding data and programs. In another embodiment, the main memory 102 represents the entire virtual memory of the computer 100, and may also include the virtual memory of other computer systems coupled to the computer 100 or connected via the network 130. The main memory 102 is conceptually a single monolithic entity, but in other embodiments the main memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory 102 stores or encodes an operating system 150, an application 160, and/or other program instructions. Although the operating system 150, application 160, etc. are illustrated as being contained within the memory 102 in the computer 100, in other embodiments some or all of them may be on different computer systems and may be accessed remotely, e.g., via the network 130. The computer 100 may use virtual addressing mechanisms that allow the programs of the computer 100 to behave as if they only have access to a large, single storage entity instead of access to multiple, smaller storage entities. Thus, while operating system 150, application 160, or other program instructions are illustrated as being contained within the main memory 102, these elements are not necessarily all completely contained in the same storage device at the same time. Further, although operating system 150, application 160, other program instructions, etc. are illustrated as being separate entities, in other embodiments some of them, portions of some of them, or all of them may be packaged together.

In an embodiment, operating system 150, application 160, and/or other program instructions comprise instructions or statements that execute on the processor 101 or instructions or statements that are interpreted by instructions or statements that execute on the processor 101, to carry out the functions as further described below with reference to FIGs. When such program instructions are able to be run by the processor 101, such computer 100 becomes a particular machine configured to carry out such instructions. For example, instructions for a memory mirroring application 160A may be loaded upon one or more computers 100A that causes the computer 100A to mirror the memory 102 into a first portion and into a redundant second portion. In another example, memory 102 may be mirrored by operating system 150. In another example, memory 102 may be mirrored by a virtualizer application 170, such as a hypervisor.

One or more processors 101 may function as a general-purpose programmable graphics processor unit (GPU) that builds images (e.g. a GUI) for output to a display. The GPU, working in conjunction with one or more applications 160, determines how to manipulate pixels on e.g. display, touch screen, etc. to create a display image or user interface. Ultimately, the image (e.g. GUI, etc.) is displayed to a user. The processor 101 and GPU may be discrete components or may be integrated into a single component.

The memory bus 103 provides a data communication path for transferring data among the processor 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer 100, and may receive output data via the user output devices. For example, a user interface may be presented via the user I/O device 121, such as displayed on a display device, played via a speaker, or printed via a printer. The user interface may be a user interface that provides content to a user visually (e.g. via a screen), audibly (e.g. via a speaker), and/or via touch (e.g. vibrations, etc.). In some embodiments, the computer 100 itself acts as the user interface as the user may move the computer 100 in ways to interact with, input, or manipulate computer application 160 data, function, etc.

The storage interface unit 112 supports the attachment of one or more local disk drives or secondary storage devices 125. In an embodiment, the secondary storage devices 125 are rotating magnetic disk drive storage devices, but in other embodiments they are arrays of disk drives configured to appear as a single large storage device to a host computer, or any other type of storage device. The contents of the main memory 102, or any portion thereof, may be stored to and retrieved from the secondary storage devices 125, as needed. The local secondary storage devices 125 have a slower access time than does the memory 102, meaning that the time needed to read and/or write data from/to the memory 102 is less than the time needed to read and/or write data from/to for the local secondary storage devices 125.

Figure 2:
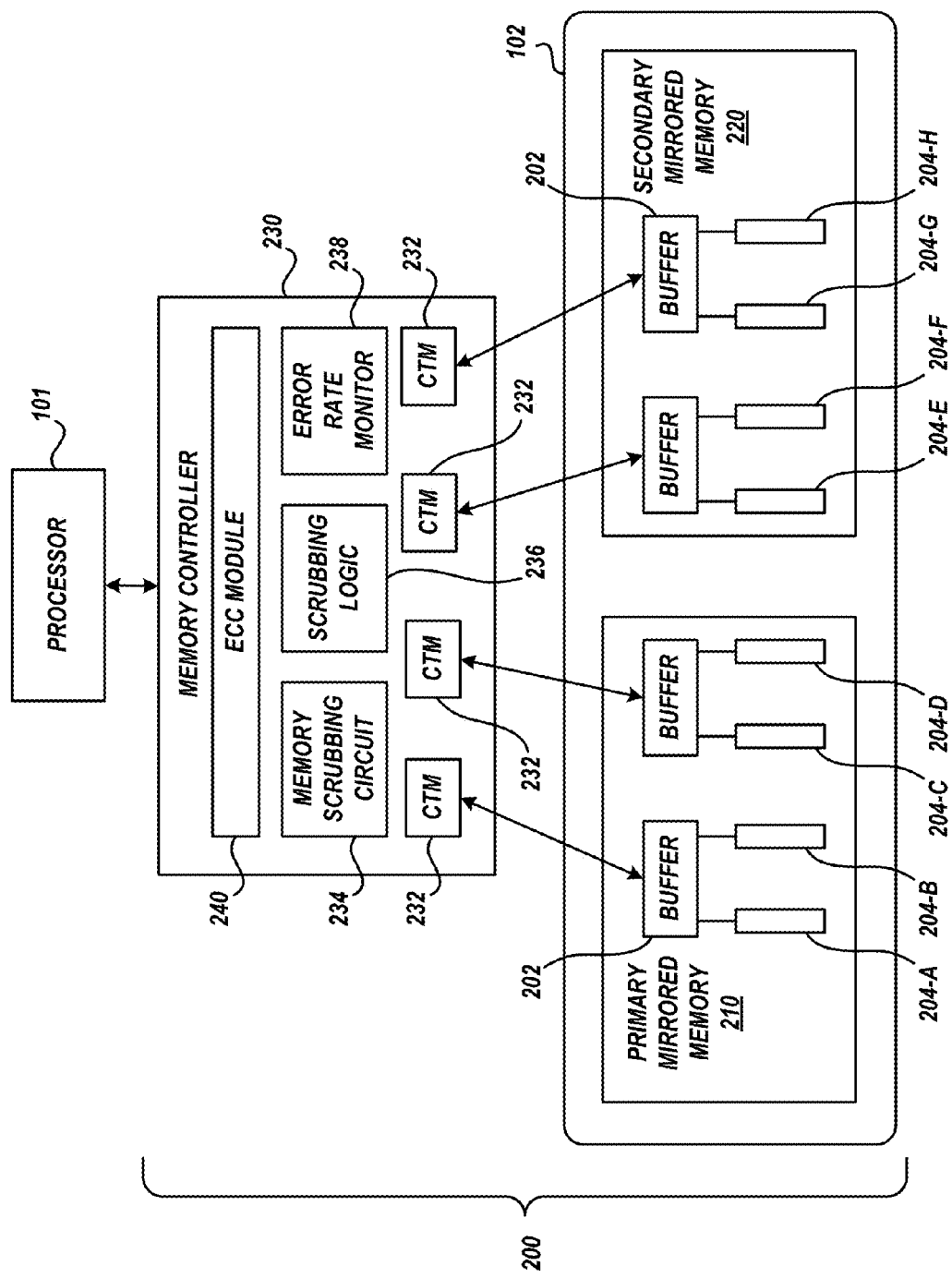
FIG. 2 illustrates a block diagram of an exemplary mirrored memory subsystem for implementing various embodiments of the invention, according to various embodiments of the present invention.

The I/O device interface 113 provides an interface to any of various other input/output devices or devices of other types, such as printers or fax machines. The network adapter 114 provides one or more communications paths from the computer 100 to other data handling devices such as numerous other computers; such paths may comprise, e.g., one or more networks 130. Although the memory bus 103 is shown in FIG. 2 as a relatively simple, single bus structure providing a direct communication path among the processors 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer 100 may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

I/O interface 113 may contain electronic components and logic to adapt or convert data of one protocol on I/O bus 104 to another protocol on another bus. Therefore, I/O interface 113 may connect a wide variety of devices to computer 100 and to each other such as, but not limited to, tape drives, optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc.

Though shown as distinct entities, the multiple I/O interface units 111, 112, 113, and 114 or the functionality of the I/O interface units 111, 112, 113, and 114 may be integrated into a similar device.

In various embodiments, the computer 100 is a multi-user mainframe computer system, a single-user system, a server computer, storage system, or similar device that has little or no direct user interface, but receives requests from other computer systems (clients). In other embodiments, the computer 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer 100A and at least the computer 100B. In various embodiments, the network 130 may represent a data handling device or a combination of data handling devices, either connected directly or indirectly to the computer 100. In another embodiment, the network 130 may support wireless communications. In another embodiment, the network 130 may support hard-wired communications, such as a telephone line or cable. In another embodiment, the network 130 may be the Internet and may support IP (Internet Protocol). In another embodiment, the network 130 is implemented as a local area network (LAN) or a wide area network (WAN). In another embodiment, the network 130 is implemented as a hotspot service provider network. In another embodiment, the network 130 is implemented an intranet. In another embodiment, the network 130 is implemented as any appropriate cellular data network, cell-based radio network technology, or wireless network. In another embodiment, the network 130 is implemented as any suitable network or combination of networks. Although one network 130 is shown, in other embodiments any number of networks (of the same or different types) may be present.

FIG. 1 is intended to depict the representative major components of the computer 100. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program instructions implementing e.g. upon computer system 100 according to various embodiments of the invention may be implemented in a number of manners, including using various computer applications, routines, components, programs, objects, modules, data structures, etc.

Embodiments of the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 2 illustrates a block diagram of an exemplary mirrored memory subsystem 220 for implementing various embodiments of the invention, according to various embodiments of the present invention.

Mirrored memory subsystem 200 may be located within computer 100 and includes a memory controller 230 that controls memory 102 that is mirrored into a primary memory portion 210 and a secondary memory portion 220. The secondary memory portion 220 is a redundant copy of the primary memory portion 210. As such, data stored in particular memory locations 204 of primary memory portion 210 is copied to associated memory locations of the secondary memory portion 220. For example, data stored in memory location 204-A is copied to memory location 204-E, data stored in memory location 204-B is copied to memory location 204-F, data stored in memory location 204-C is copied to memory location 204-G, and data stored in memory location 204-D is copied to memory location 204-H. Each memory location 204 may be associated with an address or other identifier. Multiple memory locations 204 may be associated with a buffer 202 for temporarily storing data to be written to a particular memory location or read from the particular memory location.

In particular embodiments, the memory 102 is fully mirrored in that the primary portion 210 and the secondary portion 220 are the only mirrored portions of the memory 120 and are equivalent in size. In these particular embodiments, the scrub address range matches the mirrored address range and may also be referred to as whole DIMM mirroring. For example, if memory 102 is an 8 GB dual in-line memory module (DIMM), the operating system 150 sees a 4 GB memory space of the primary portion 210 or the secondary portion 220.

Mirrored memory subsystem 200 includes circuits or subassemblies as well as methods of operation, adapted to mitigate the effects of memory scrub operations on idle time power savings modes of the memory controller 230. Memory controllers of computing systems have two features that can conflict during operation of the computing system: scrub operations and low power operation mode.

The scrubbing feature includes a memory scrubbing circuit 234 or scrub engine that operates to mitigate correctable errors (CEs) before the CEs become uncorrectable errors (UEs). In particular, if the memory scrubbing circuit 234 identifies a CE, it corrects and removes the error, as described in further details below. The scrub engine 234 reads a cacheline at a time at a rate that typically covers all of the memory 102 behind the memory controller 102 in a 12 to 24 hour period.

In embodiments, due to a large size of memory 102, memory 102 can consume large amounts of power to operate in the computing system. For example, memory 102 may include numerous DIMMs. The DIMMs include a series of dynamic random-access memory integrated circuits of the computing systems. Further, memory 102 can include different levels of parameters of power modes, including, low power (LP) mode, rank power down, or self-time refresh that main memory can operate within. LP mode significantly reduces power in DIMMs or processor 101 of the computing systems. Entering or exiting LP mode can adversely affect the performance of the computing system. Therefore, LP mode is typically entered only when it is likely that the computing system will be in idle for a significant amount of time in the context of computer operation. For example, the memory controller 230 would typically not enter LP mode immediately when its memory queue goes idle because any memory operation that needs to run while the memory subsystem 200 is in LP mode, has to wait significant amount of time (for example 1 us) for the memory controller 230 to exit LP mode before it can begin operation. Therefore, memory controller 230 attempt to put the memory subsystem in LP mode only when they are reasonably sure that the memory controller queue will be idle for a significant period of time. The memory controller 230 typically determines this via an Idle Timer which makes sure the queue is idle for a decent amount of time (for example 20 us) before deciding that the queue is truly idle. The idle timer usually avoids mistaking brief temporary idle conditions that happen frequently with a real prolonged period of idle that can be safely put into Low Power mode thereby achieving power savings without negatively impacting performance. The scrubbing circuit 234 of the memory controller 230 can adversely affect power consumption of memory subsystem 200 during operation of the memory controller 230 because the scrubbing mechanism utilizes memory 102 and buffer 202 which must be taken out of low power mode just to perform the scrub operation.

For instance, a computing system which is idle based on processor workload can still periodically conduct scrubbing operations of memory controller 230 to meet the a predetermined requirement of memory scrubbing, for example, every twelve hours of operation of the computing system. However, when scrub operations are conducted during idle mode of the computing system, the scrub forces memory 102 to exit LP mode in order to perform the scrub operation, and waits for the idle timer in the memory controller 230 to expire before allowing the memory to re-enter LP mode.

Furthermore, because the intent of the idle timer of memory 102 of the computing system is to confirm that the computing system is really idle and has not just gone into some momentary cache contained loops, applying the idle timer of the computing system to background scrub operations defeats the purpose of the idle timer, and can keep the computing system out of LP mode for long periods of time unnecessarily. Therefore, the scrub feature of the computing system can cause unnecessary power consumption of the computing system when the computing system is idle during the background scrub operation which could cause the product to fail power efficiency standards, including, for example, Energy Star program that enhances energy efficiency for businesses and individuals.

The memory controller 230 is communicatively coupled to processor 101 and to memory 102. The memory controller 230 may be communicatively coupled to processor 101 and to memory 102 via memory bus 103. Memory controller 230 includes one or more channel traffic monitors 232, memory scrubbing circuit 234, scrubbing logic 236, soft error rate monitor 238, and ECC module 240.

The memory controller 230 is a circuit that manages the flow of data going to and from memory 102. Memory controller 230 can be a separate chip or integrated into another chip, such as being placed on the same die or as an integral part of the processor 101. In the latter, the memory controller 230 may be referred to as an integrated memory controller (IMC). Memory controller 230 may also be referred to as a memory chip controller (MCC) or a memory controller unit (MCU). Memory controller 230 may be connected to different kinds of memory 102 simultaneously, including SDRAM, SRAM, ROM, memory-mapped I/O, etc. While each kind of these memories may require a slightly different control bus, memory controller 230 may present a common bus to the processor 101.

Channel traffic monitor (CTM) 232 is a circuit that monitors rate of data going to and or from memory 102. In particular, CTM 232 monitors the rate of data being read by memory controller 230 from memory 102. A CTMs 232 is associated with a particular data flow channel between memory controller 230 and memory 102. If there are multiple data flow channels between memory controller 230 and memory 102 a particular CTM 232 may be associated with each particular data channel. For example, a high memory bus 103 width allows for a number of parallel lines available for the memory controller 230 to communicate with multiple buffers 202 of the memory 102. A particular CTM 232 may be associated with each particular line.

Memory scrubbing circuit 234 requests a read of data stored at addresses of memory 102 to identify or detect errors in the data read. According to embodiments of the present invention, memory 102 is scrubbed for bit errors by memory scrubbing circuit 234, wherein memory scrubbing circuit 234 requests reads of data stored in memory 102 from memory controller 230. For instance, memory scrubbing circuit 234 requests reads of data stored in memory 102 so that single bit errors and multiple-bit errors can be identified or detected in the data stored, from the reads of data. Furthermore, memory scrubbing circuit 234 requests reads of data stored in memory 102 to detect and correct single bit errors, before those single bit errors accumulate into double or multiple-bit errors. For example, one single bit error in a data word may be a single-bit error that can be corrected by a correction algorithm. However, if another single-bit error develops in the data word, the data word now has a double-bit error, which may not be correctable. In this manner, it is desirable to scrub data words of memory 102 to correct single-bit errors before they become or accumulate into double bit errors. When data is inserted or written to memory 102, ECC module 240 may keep or generate one, two or more bits of data for each byte stored in memory 164 as an error correction code (ECC) for that byte. Keeping or generating the code may be according to an algorithm implemented in ECC module 240 by hardware, software, logic, processors, etc. In one aspect, the correction code from ECC module 240 may be stored in memory 102, such as by being stored in memory 102 with the bytes of data corresponding to the code.

For instance, one or more bits may be appended to one end of the data byte they correspond to, and the appended byte may then be stored in memory 102. Therefore, when data is read from memory 102, each byte of the read data may be compared with error correction code stored in memory 102, to ensure that there are no errors in the bits of the byte. For example, error correction code from ECC 240 may be stored in memory 102. In this manner, the more bits kept per byte in an ECC code (e.g., stored in memory 102 with the corresponding byte), the more accurate error detection can be and the more error bits that can be corrected for a single data read or byte. Therefore, identified errors of memory may be corrected or scrubbed, for example, by memory scrubbing circuit 234, which includes a correction circuit and/or logic to implement single-bit error correction to correct a single-bit error identified in memory 102.

Soft error rate monitor 238 is a circuit that determines the number of soft errors detected by memory scrubbing circuit 234 per time period. Soft error rate monitor 238 may also be referred to as a soft error rate sensor, or radiation flux sensor.

In an embodiment, the CTM 232, memory scrubbing circuit 234, error rate monitor 238, and ECC module 240 are separate circuits located within memory controller 230. In another embodiment, one or more parts of each of these aforementioned circuits may be included in one or more other circuits of memory controller 230.

Figure 3:
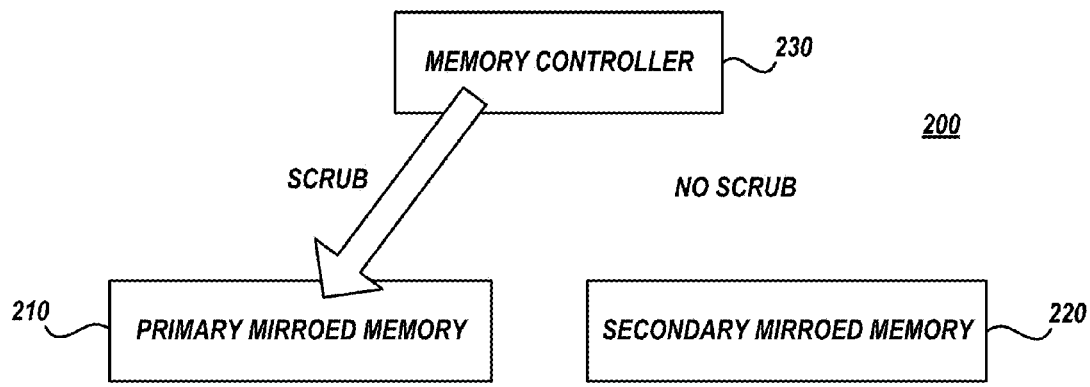
FIG. 3 illustrates a block diagram of memory scrubbing in a mirrored memory subsystem, according to various embodiments of the present invention.

FIG. 3 illustrates a block diagram of memory scrubbing in mirrored memory subsystem 200. According to a particular embodiment, memory scrubbing circuit 234 scrubs only the primary portion 210 of the mirrored memory 102 to detect and correct soft errors therein. Such scrubbing operation allows memory scrubbing circuit 234 to mitigate correctable errors (CEs) before the CEs become uncorrectable errors (UEs) in only the primary mirrored memory portion 210. In particular, if the memory scrubbing circuit 234 identifies a CE within the primary portion 210, it corrects and removes the error. The memory scrubbing circuit 234 reads a cacheline located within the primary portion 210 at a time and rate that typically covers all of the primary portion 210 in a 6 to 24 hour period. Such scrub rate of the memory scrubbing circuit scrubbing only the primary portion 210 may be referred herein as a reference scrub rate.

The memory scrubbing circuit 234 may scrub only the primary portion 210 by limit scrubbing operations to addresses of storage locations 204 of the primary portion 210. The memory scrubbing circuit 234 may scrub only the primary portion 210 by blocking scrubbing operations to addresses of storage locations 204 of the secondary portion 220. In order to determine the address range of the primary portion 210 the mirroring resource such as a mirroring application, operating system, hypervisor, etc. may communicate the address range of the primary portion 210 and/or the address range of the secondary portion 220 to the memory controller and/or the memory scrubbing circuit 234.

By the memory scrubbing circuit 234 scrubbing only the primary portion 210, memory controller 230 needs not read from secondary portion 220 in order for the scrubbing circuit 234 to scrub the data within the secondary portion 220, thus reducing the power consumed by the mirrored memory subsystem 200.

In this embodiment, since memory scrubbing of the secondary portion 220 is principally turned off, soft errors may accumulate to the point where a UE develops within the secondary portion. If that happens, a mainline read may obtain good data from the primary portion 210 of the mirrored memory 102. If a mainline read detects a UE from the secondary portion 220, then associated good data can be copied from the primary portion 210 to appropriate memory location(s) of the secondary portion 220 to fix the bad data.

In another embodiment, since scrubbing operations associated with the scrubbing of the primary portion 210 uses up some of the availability of the primary portion 210, memory controller 230 may read data associated with requests from processor 101 (i.e. functional data read in association with the execution of an application 160) from the non-scrubbed secondary portion 220 to increase performance of the data read. The memory controller 230 may read a greater quantity of data from the non-scrubbed secondary portion 220 relative to the quantity of data from the scrubbed primary portion 210. For example, the memory controller 230 may read only from the non-scrubbed secondary portion 220.

Figure 4:
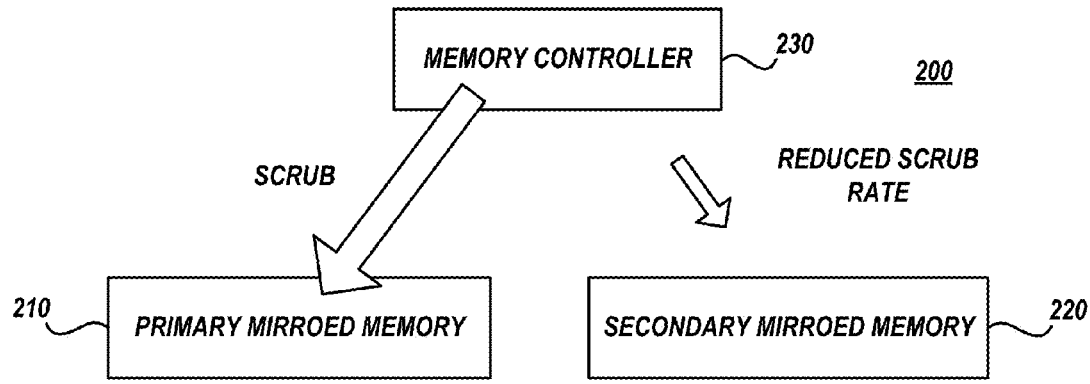
FIG. 4 illustrates a block diagram of memory scrubbing in a mirrored memory subsystem, according to various embodiments of the present invention.

FIG. 4 illustrates a block diagram of memory scrubbing in mirrored memory subsystem 200. According to a particular embodiment, memory scrubbing circuit 234 scrubs the primary portion 210 at the reference scrub rate and scrubs the secondary portion 220 at a scrub rate less than the reference scrub rate to detect and correct soft errors therein. Such scrubbing operation allows memory scrubbing circuit 234 to mitigate correctable errors (CEs) before the CEs become uncorrectable errors (UEs) in the primary mirrored memory portion 210 and the memory portion 220 at a reduced rate to conserve power. In certain embodiments, the reduced scrub rate is proportional to the number of soft errors detected by soft error rate monitor 238 associated with the memory scrubbing circuit 234 scrub of primary portion 210. For example, the memory scrubbing circuit 234 utilizes a slower reduced scrub rate to scrub the secondary portion 220 is fewer soft errors are detected by soft error rate monitor 238 associated with the memory scrubbing circuit 234 scrub of primary portion 210.

A particular implementation of the reduced scrub rate of the secondary portion 220 is a static scrub rate reduction. In this implementation memory scrubbing circuit 234 scrubs the primary portion 210 at the reference rate and the secondary portion 220 at a constant reduced scrub rate. For example, computer 100 boots or operates with the reference scrub rate of the primary portion 210 and 'n' times reduced rate of the secondary copy, where 'n' is a number greater than one.

Another implementation dynamically adjusts the reduced scrub rate based on the number of soft errors detected by soft error rate monitor 238 associated with the memory scrubbing circuit 234 scrub of primary portion 210. For example, if the quantity of soft errors detected by soft error rate monitor 238 associated with the memory scrubbing circuit 234 scrub of primary portion 210 exceeds a predetermined threshold over a particular time period, the reduced scrub rate associated with the memory scrubbing circuit 234 scrub of secondary portion 220 is increased. This reduced scrub rate is increased because the increased soft errors associated primary portion 210 is indicative of the number of potentially encountered soft errors of the secondary portion, due to memory mirroring. The adjustment of the reduced scrub rate of the secondary memory portion 220 based on detection of soft errors by error rate monitor 238 that occur while computer 100 is operating allows for in the field learning and read power reductions.

By the memory scrubbing circuit 234 scrubbing the primary portion 210 at the reference scrub rate and the secondary portion 220 at a reduced scrub rate, memory controller 230 reads less from secondary portion 220 in order for the scrubbing circuit 234 to scrub the data within the secondary portion 220, thus reducing the power consumed by the mirrored memory subsystem 200. Thus, in environments where there is no error rate or very low, the dynamic adjustment scheme lowers the scrub rate of the secondary portion 220 to realize measurable power savings. In a particular scenario where the reduced scrub rate associated with the secondary portion 220 reduced by half, read power consumption associated with the secondary portion 220 will also be reduced by half.

Figure 5:
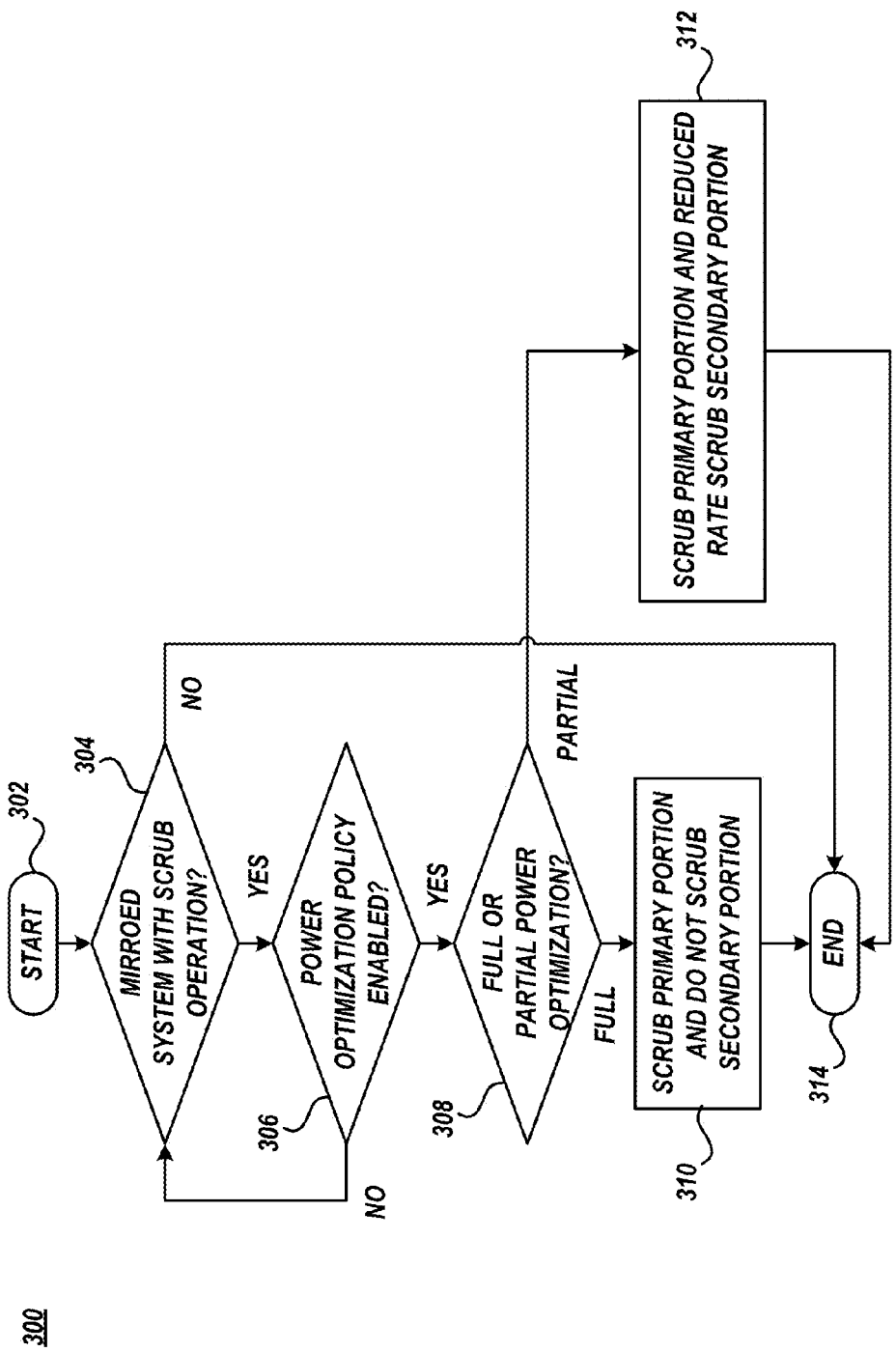
FIG. 5 illustrates an exemplary process for power consumption optimized memory scrubbing in a mirrored memory subsystem, according to various embodiments of the present invention.

FIG. 5 illustrates an exemplary process 300 for power consumption optimized memory scrubbing in a mirrored memory subsystem. Process 300 may be utilized by computer 100 including a mirrored memory subsystem 200 to reduce power consumption associated with scrubbing at least one portion of the mirrored memory 102. Process 300 is an exemplary scrubbing logic 236 routine and may be stored upon memory 102 and evoked by processor 101 to cause one or more computing devices to functionally implement one or more of the various blocks of process 300.

Process 300 begins at block 302 and continues with computer 100, processor 101, and/or memory controller 320 determining whether it is associated with a mirrored memory 102 including a primary portion 210 and secondary portion 220 and is associated with a mirrored memory 102 scrubbing operation (block 304). For example, memory controller 230 may receive address ranges of the primary portion 210 and secondary portion 220 from the mirroring resource and communicate one or more of the address ranges of the primary portion 210 and/or secondary portion 220 to memory scrubbing circuit 234. If the computer 100, processor 101, and/or memory controller 320 determines it is not associated with a mirrored memory 102 or is not associated with a mirrored memory 102 scrubbing operation, process 300 ends at block 314.

If the computer 100, processor 101, and/or memory controller 320 determines it is associated with a mirrored memory 102 and is associated with a mirrored memory 102 scrubbing operation, process 300 continues by computer 100, processor 101, and/or memory controller 320 determining whether computer 100 is operating in a power saving, power optimization, or other power reduction mode (block 306). If computer 100 is not operating in a power saving, power optimization, or other power reduction mode, process 300 returns to block 304.

If computer 100 is operating in a power saving, power optimization, or other power reduction mode, process 300 continues by computer 100, processor 101, and/or memory controller 320 determining whether computer 100 is operating in a full power saving, full power optimization, or other maximized power reduction mode (block 308). If computer 100 is operating in a full power saving, full power optimization, or other maximized power reduction mode, process 300 continues by memory controller 230 scrubbing the primary memory portion 210 at the reference scrub rate and not scrubbing the secondary memory portion 220 (block 310). For example, memory controller 230 scrubs the primary memory portion 210 and may turn off the scrubbing of the secondary memory portion 220.

If computer 100 is operating in a partial power saving, partial power optimization, or other less-than-maximized power reduction mode, process 300 continues by memory controller 230 scrubbing the primary memory portion 210 at the reference scrub rate and scrubbing the secondary memory portion 220 at a reduced scrub rate less than the reference scrub rate (block 312). For example, memory controller 230 scrubs the primary memory portion 210 and scrubs the secondary memory portion 220 at an 'x' times reduced rate, wherein 'x' is a number greater than one. Process 300 ends at block 314.

Figure 6:
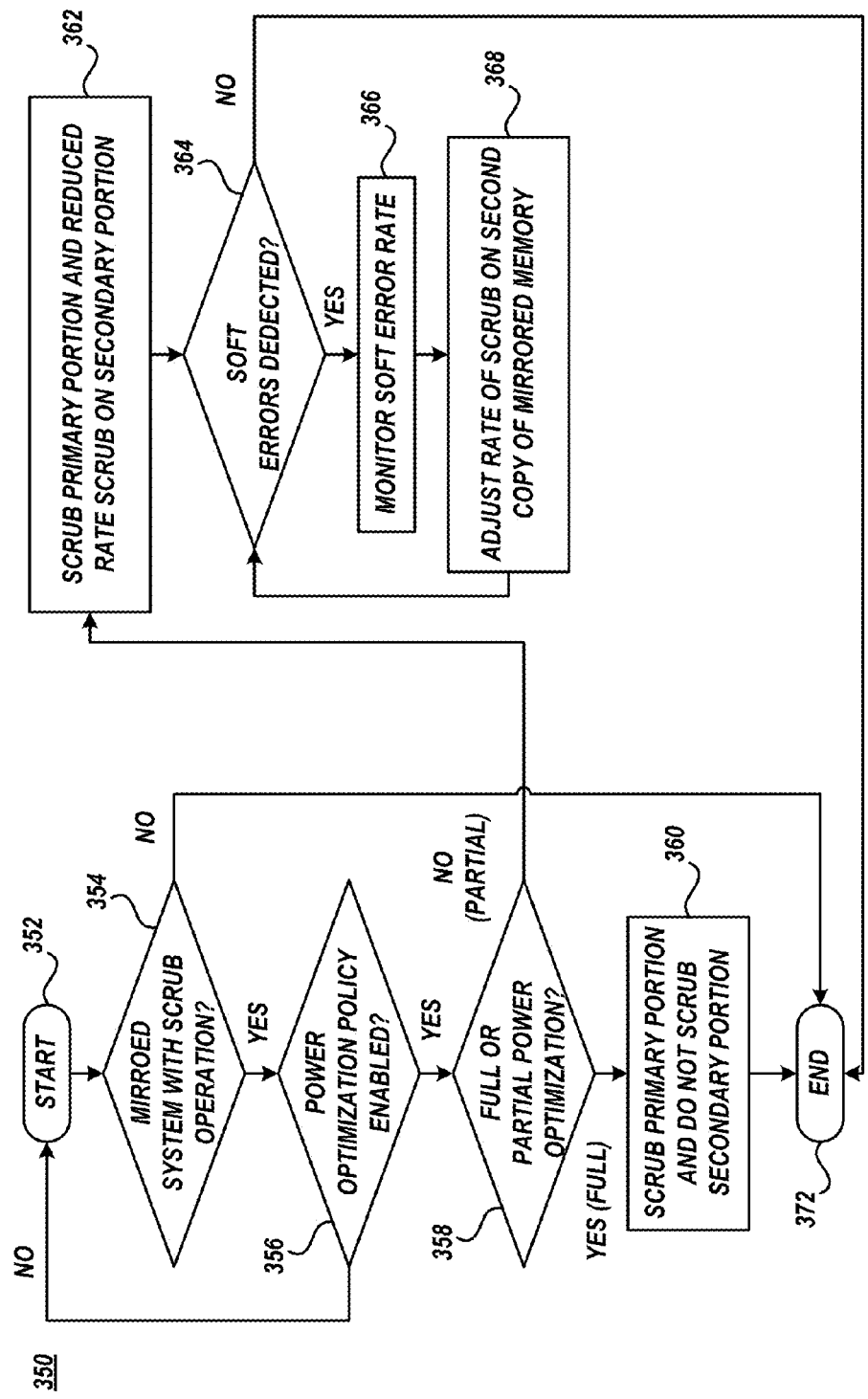
FIG. 6 illustrates an exemplary process for power consumption optimized memory scrubbing in a mirrored memory subsystem, according to various embodiments of the present invention.

FIG. 6 illustrates an exemplary process 350 for power consumption optimized memory scrubbing in a mirrored memory subsystem. Process 350 may be utilized by computer 100 including a mirrored memory subsystem 200 to reduce power consumption associated with scrubbing at least one portion of the mirrored memory 102. Process 350 may be a portion of scrubbing logic 236 routine and may be stored upon memory 102 and evoked by processor 101 to cause one or more computing devices to functionally implement one or more of the various blocks of process 350.

Process 350 begins at block 352 and continues with computer 100, processor 101, and/or memory controller 320 determining whether it is associated with a mirrored memory 102 including a primary portion 210 and secondary portion 220 and is associated with a mirrored memory 102 scrubbing operation (block 354). For example, memory controller 230 may receive address ranges of the primary portion 210 and secondary portion 220 from the mirroring resource and communicate one or more of the address ranges of the primary portion 210 and/or secondary portion 220 to memory scrubbing circuit 234. If the computer 100, processor 101, and/or memory controller 320 determines it is not associated with a mirrored memory 102 or is not associated with a mirrored memory 102 scrubbing operation, process 350 ends at block 372.

If the computer 100, processor 101, and/or memory controller 320 determines it is associated with a mirrored memory 102 and is associated with a mirrored memory 102 scrubbing operation, process 350 continues by computer 100, processor 101, and/or memory controller 320 determining whether computer 100 is operating in a power saving, power optimization, or other power reduction mode (block 356). If computer 100 is not operating in a power saving, power optimization, or other power reduction mode, process 350 returns to block 352.

If computer 100 is operating in a power saving, power optimization, or other power reduction mode, process 350 continues by computer 100, processor 101, and/or memory controller 320 determining whether computer 100 is operating in a full power saving, full power optimization, or other maximized power reduction mode (block 358). If computer 100 is operating in a full power saving, full power optimization, or other maximized power reduction mode, process 350 continues by memory controller 230 scrubbing the primary memory portion 210 at the reference scrub rate and not scrubbing the secondary memory portion 220 (block 360). For example, memory controller 230 scrubs the primary memory portion 210 and may turn off the scrubbing of the secondary memory portion 220.

If computer 100 is operating in a partial power saving, partial power optimization, or other less-than-maximized power reduction mode, process 350 continues by memory controller 230 scrubbing the primary memory portion 210 at the reference scrub rate and scrubbing the secondary memory portion 220 at a reduced scrub rate less than the reference scrub rate (block 362). For example, memory controller 230 scrubs the primary memory portion 210 and scrubs the secondary memory portion 220 at an 'x' times reduced rate, wherein 'x" is a number greater than one.

Process 350 continues by computer 100, processor 101, and/or memory controller 320 detecting soft errors associated with the scrubbing of primary memory portion 210 (block 364). If soft errors associated with the scrubbing of primary memory portion 210 are detected the soft error rate associated with the scrubbing of primary memory portion 210 is monitored (block 366). If computer 100, processor 101, and/or memory controller 320 detects soft errors associated with the scrubbing of primary memory portion 210, the memory controller 320 adjusts the reduced scrub rate associated with the scrub of the secondary memory portion 220 (block 368). For example, if greater than a maximum threshold number of soft errors are detected during a time period, the reduced scrub associated with the secondary portion 220 rate may be increased relative to the reference scrub rate. If less than a minimum threshold number of soft errors are detected during a time period, the reduced scrub associated with the secondary portion 220 rate may be decreased relative to the reference scrub rate. Following block 368, process 350 continues by returning to block 364. If soft errors associated with the scrubbing of primary memory portion 210 are not detected (block 364), process 350 ends at block 372.

The terms "primary memory portion" and "secondary memory portion" may be interchangeable herein. For example, whereas the reference scrub rate has been described with reference to the primary portion 210 and the reduced scrub rate has been described with reference to the secondary portion 220, the reference scrub rate may be associated with the secondary portion 220 and the reduced scrub may be associated with the primary portion 210, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A method to reduce power consumption of a fully mirrored memory subsystem comprising: receiving, with a memory controller, a scrub address range that defines a first memory portion of a fully mirrored memory module and a mirrored address range that defines a second memory portion of the fully mirrored memory module that is redundantly mirrored to the first memory portion, wherein the fully mirrored memory module consists of the first memory portion and the second memory portion equal in storage capacity to the first memory portion; reading, with the memory controller, data that is stored in the first memory portion and data that is stored in the second memory portion; scrubbing, with the memory controller, first data read from the first portion at a reference scrub rate; scrubbing, with the memory controller, second data mirroring the first data read from the second portion at a reduced scrub rate that is adjusted to be constantly less than the reference scrub rate; monitoring, with the memory controller, a soft error rate of first data read from the first portion and scrubbed; and adjusting the reference scrub rate and the reduced scrub rate based upon the monitored soft error rate of first data scrubbed from the first portion.

2. The method of claim 1, wherein the reduced scrub rate is increased if the rate of soft errors detected within the first data read from the first memory portion exceeds a predetermined maximum threshold.

3. The method of claim 1, wherein the reference scrub rate and the reduced scrub rate is decreased if the rate of soft errors detected within the first data read from the first memory portion is less than a predetermined minimum threshold.

4. The method of claim 1, wherein the first memory portion comprises a plurality of memory locations that are collectively identified by the scrub address range such that each scrub address within the scrub address range identifies a respective first memory portion memory location, wherein the second memory portion comprises a plurality of memory locations that are collectively identified by the mirrored address range such that each mirrored address within the mirrored address rage identifies a respective second memory portion memory location.

5. The method of claim 1, wherein corrected first data is copied from the first memory portion to a mirrored memory location within the second memory portion if the memory controller identifies an uncorrectable error within second data read from the mirrored memory location within the second memory portion.

6. The method of claim 1, wherein reading at the reduced scrub rate reduces the data that the memory controller reads from the second memory portion and scrubs.

7. The method of claim 6, wherein power consumed by the fully mirrored memory subsystem is proportional to the second data memory controller reads from the second memory portion.

* * * * *